United States Patent
Schiek et al.

(10) Patent No.: US 12,068,734 B2
(45) Date of Patent: Aug. 20, 2024

(54) METHOD FOR FORMING AN ALUMINUM NITRIDE LAYER

(71) Applicant: RF360 Singapore Pte. Ltd., Singapore (SG)

(72) Inventors: Maximilian Schiek, Puchheim (DE); Christian Ceranski, Munich (DE); Günter Scheinbacher, Baldham (DE)

(73) Assignee: RF360 Singapore Pte. Ltd., Singapore (SG)

(*) Notice: Subject to any disclaimer, the term of this patent is extended or adjusted under 35 U.S.C. 154(b) by 945 days.

(21) Appl. No.: 16/976,886

(22) PCT Filed: Feb. 19, 2019

(86) PCT No.: PCT/EP2019/054111
§ 371 (c)(1),
(2) Date: Aug. 31, 2020

(87) PCT Pub. No.: WO2019/166285
PCT Pub. Date: Sep. 6, 2019

(65) Prior Publication Data
US 2021/0006220 A1    Jan. 7, 2021

(30) Foreign Application Priority Data
Mar. 1, 2018 (DE) .......... 102018104712.6

(51) Int. Cl.
*H03H 3/04* (2006.01)
*H03H 9/02* (2006.01)
(Continued)

(52) U.S. Cl.
CPC .......... *H03H 3/04* (2013.01); *H03H 9/02031* (2013.01); *H03H 9/02102* (2013.01);
(Continued)

(58) Field of Classification Search
CPC .. H03H 3/04; H03H 9/02031; H03H 9/02102; H03H 9/08; H03H 9/13;
(Continued)

(56) References Cited

U.S. PATENT DOCUMENTS

| | | | |
|---|---|---|---|
| 10,050,142 B2 * | 8/2018 | Nakayama | .......... H01L 29/1083 |
| 2005/0088257 A1 * | 4/2005 | Ruby | .............. H03H 3/04 |
| | | | 333/187 |

(Continued)

FOREIGN PATENT DOCUMENTS

| | | | | |
|---|---|---|---|---|
| CA | 2031629 A1 * | 6/1991 | .......... | C01B 21/072 |
| CN | 105262456 A | 1/2016 | | |

(Continued)

OTHER PUBLICATIONS

Ruopeng Deng, "Aluminum nitride, Scandium nitride, and Aluminum-Scandium-Nitride ternary alloys : Structural, optical, and electrical properties" (https://ui.adsabs.harvard.edu/abs/2013PhDT.......262D/abstract) ProQuest Dissertations And Theses; Thesis (Ph.D.)—Rensselaer Polytechnic Institute, 2013.*

(Continued)

*Primary Examiner* — Jeffrey T Carley
(74) *Attorney, Agent, or Firm* — Patterson + Sheridan LLP

(57) ABSTRACT

A method for forming an aluminum nitride layer (310, 320) comprises the provision of a substrate (100) and the forming of a patterned metal nitride layer (110). A bottom electrode metal layer (210) is formed on the exposed portions (101) of the substrate. An aluminum nitride layer portion (320) grown above the exposed portion (101) of the substrate (100) exhibits piezoelectric properties. An aluminum nitride layer portion (310) grown above the patterned metal nitride (Continued)

layer (110) exhibits no piezoelectric properties (310). Both aluminum nitride layer portions (320, 310) are grown simultaneously.

11 Claims, 3 Drawing Sheets

(51) Int. Cl.
    *H03H 9/08*     (2006.01)
    *H03H 9/13*     (2006.01)
    *H03H 9/17*     (2006.01)
    *H10N 30/079*     (2023.01)
    *H03H 3/02*     (2006.01)

(52) U.S. Cl.
    CPC ............... *H03H 9/08* (2013.01); *H03H 9/13* (2013.01); *H03H 9/175* (2013.01); *H03H 9/176* (2013.01); *H10N 30/079* (2023.02); *H03H 2003/025* (2013.01); *H03H 2003/0407* (2013.01)

(58) Field of Classification Search
    CPC .. H03H 9/175; H03H 9/176; H03H 2003/025; H03H 2003/0407; H10N 30/079; C01B 21/072; C23C 28/34
See application file for complete search history.

(56) References Cited

U.S. PATENT DOCUMENTS

| | | | |
|---|---|---|---|
| 2006/0046319 A1 | 3/2006 | Takeda | |
| 2012/0319530 A1 | 12/2012 | Burak et al. | |
| 2014/0292149 A1* | 10/2014 | Zou | H03H 3/04 310/346 |
| 2014/0292150 A1* | 10/2014 | Zou | G10K 11/04 310/346 |
| 2017/0288121 A1* | 10/2017 | Burak | H03H 9/02118 |
| 2018/0278228 A1* | 9/2018 | Hurwitz | H10N 30/40 |
| 2019/0173452 A1* | 6/2019 | Block | H03H 9/02015 |
| 2019/0190489 A1* | 6/2019 | Dasgupta | H03H 9/205 |
| 2019/0372543 A1* | 12/2019 | Qian | H03H 9/13 |
| 2020/0013948 A1* | 1/2020 | Moe | C23C 14/34 |

FOREIGN PATENT DOCUMENTS

| | | | | |
|---|---|---|---|---|
| CN | 116346067 A | * | 6/2023 | |
| DE | 112009000947 T5 | | 9/2011 | |
| DE | 102012210160 A1 | | 12/2012 | |
| DE | 102017129160 B3 | * | 1/2019 | ............... H03H 3/02 |
| KR | 20170121712 A | * | 11/2017 | |
| WO | 03012988 A2 | | 2/2003 | |

OTHER PUBLICATIONS

International Search Report and Written Opinion dated Jun. 4, 2019, corresponding to Application No. PCT/EP2019/054111.
Iriarte G.F., et al., "Synthesis of C-Axis-Oriented AlN Thin Films on High-Conducting Layers: Al, Mo, Ti, TiN, and Ni", IEEE Transactions on Ultrasonics, Ferroelectrics and Frequency Control, IEEE, US, vol. 52, No. 7, Jul. 1, 2005 (Jul. 1, 2005), pp. 1170-1174, XP011367426, ISSN: 0885-3010, DOI: 10.1109/TUFFC.2005. 1504003, Section II, Figure 4.
Vergara L., et al., "Influence of Oxygen and Argon on the Crystal Quality and Piezoelectric Response of AlN Sputtered Thin Films", Diamond and related materials, 2004, 13. Jg., Nr. 4-8, S. pp. 839-842.

* cited by examiner

METHOD FOR FORMING AN ALUMINUM NITRIDE LAYER

CROSS-REFERENCE TO RELATED APPLICATIONS

This application is a national stage application under 35 U.S.C. 371 of PCT/EP2019/054111 filed, Feb. 19, 2019, which claims the benefit of German Application No. 10 2018 104 712.6, filed Mar. 1, 2018, both of which are incorporated herein by reference in their entireties.

TECHNICAL FIELD

The present disclosure relates to a method for forming an aluminum nitride layer. Specifically, the present disclosure relates to the forming of an aluminum nitride layer on a substrate, wherein different portions of the aluminum nitride layer have different properties.

BACKGROUND

Aluminum nitride is a material that is widely used in the field of electronic components. The function of the components is often based on the piezoelectric properties of an aluminum nitride (AlN) layer. In many cases other components or functions are included on the same chip that may use aluminum nitride for properties other than its piezoelectric properties. This requires aluminum nitride to be deposited on the substrate having piezoelectric and non-piezoelectric properties.

Aluminum nitride is often used for bulk acoustic wave (BAW) resonators in which an electrical signal causes an acoustical resonating wave in a layer of the piezoelectric aluminum nitride sandwiched between two electrical electrodes. There may be a need to include other components using aluminum nitride on the same substrate, that exploit the mechanical properties of AlN rather than the piezoelectric properties. For example, AlN can be used as the dielectric layer for on-chip capacitors. Furthermore, AlN can be used as a thermal conductor to transport the heat generated in the acoustic resonator to a heat sink. In these cases, it is preferred to employ aluminum nitride without piezoelectric properties so that the electro-acoustic function of the component is not affected.

There is a need to grow aluminum nitride having piezoelectric properties and having non-piezoelectric properties on the same substrate. There is another need to simultaneously grow aluminum nitride having piezoelectric and non-piezoelectric properties on the same substrate.

It is an object of the present disclosure to provide a method for growing aluminum nitride with piezoelectric and non-piezoelectric properties on the same substrate.

SUMMARY

According to an embodiment, a method for forming aluminum nitride comprises: providing a substrate; forming a metal nitride layer on the substrate; patterning the metal nitride layer to form a residual metal nitride layer and to expose a portion of the substrate; forming a metal layer on the exposed portion of the substrate; forming aluminum nitride on the metal layer and above the metal nitride layer.

Piezoelectric AlN exhibits a regular structure that has a strong orientation along the C-axis. In other words, the piezoelectric AlN has a columnar orientation with columns that substantially extend along one major direction which is the C-axis or compression axis of the crystal. The piezoelectric AlN has a crystalline state that exhibits columnar, C-axis orientation. The axis of orientation is substantially perpendicular to the main surface of the substrate on which aluminum nitride is grown.

Non-piezoelectric AlN has no such crystalline or columnar or C-axis orientation. Instead, non-piezoelectric AlN is amorphous or can be polycrystalline. As there is practically no major orientation in such a polycrystalline or amorphous layer of AlN, such an AlN layer has no or at least no exploitable piezoelectric properties.

According to the embodiment, the method comprises a step of forming a metal nitride layer on the substrate. The metal nitride layer provides an orientation prohibiting function so that AlN grown above the region of the metal nitride layer has substantially no crystalline orientation and is grown in polycrystalline or amorphous form, whereas AlN grown directly on the substrate without underlying metal nitride performs a relatively good oriented nucleation during its growth on the substrate.

According to the embodiment, the metal nitride layer deposited on the substrate is patterned to form one or more portions of a residual metal nitride layer and remove the remainder of the metal nitride layer and thereby expose a portion of the surface of the substrate.

Then, a metal layer for a bottom electrode is formed at least on the exposed portion of the substrate. In another embodiment, the metal layer is formed on the residual metal nitride layer and on the exposed portion of the substrate. The metal layer of the bottom electrode may be formed simultaneously in one deposition step on the residual metal nitride layer and on the exposed portions of the substrate.

The deposited metal layer inherits the structure of the underlying layer, either the structure of the underlying metal nitride layer that has substantially no major orientation in that it is orientation-disturbing, or the structure from the underlying substrate that enables the growth of a C-axis oriented AlN layer.

Then, aluminum nitride is formed on the previously deposited metal layer in the area of the exposed substrate and above the residual metal nitride layer. The metal layer may also cover the residual metal nitride layer and, thus, all the surface of the workpiece including the exposed portion of the substrate and the residual metal nitride layer, so that the aluminum nitride is formed on the deposited metal layer of the bottom electrode level. This aluminum nitride inherits the surface structure provided by that metal layer or the metal nitride layer. The AlN deposited above the orientation-disturbing metal nitride layer has substantially no orientation and is amorphous or polycrystalline so that it has no piezoelectric properties. In this area, the AlN can be used, for example, as a dielectric layer for a capacitor or as a thermal conductor. In the area with no underlying metal nitride, AlN is grown with columnar, C-axis, crystalline orientation so that it exhibits piezoelectric properties. It is well known in the art how to set suitable operation parameters for the deposition of AlN so that it grows with columnar, C-axis, crystalline orientation.

It is to be noted, in general, that AlN has good thermal conductivity that is substantially higher than the thermal conductivity rates of other dielectric materials. For example, AlN has a thermal conductivity coefficient in the range of about 180 W/Km. Heat generated in the component can be efficiently guided to a thermal heat sink so that a temperature drift of the parameters of the component is reduced or avoided.

According to the present disclosure, with the structuring of the underlying orientation-disturbing or orientation-prohibiting metal nitride layer, piezoelectric and non-piezoelectric AlN can be grown simultaneously on a workpiece. This advantage may be useful for electroacoustic components such as BAW resonators that may have additional components or features on the same chip or require a stable temperature behaviour.

The patterning of the metal nitride layer can be achieved by conventional photolithography. Photolithography processes are well-known in the art to achieve a well-controlled result of a patterned metal nitride structure. Photolithography comprises the coating of the metal nitride layer with a photoresist layer. The photoresist layer is exposed to a pattern of radiation of, for example, visible light, UV light or radiation of lower wavelength in an exposure tool, in which a mask pattern is illuminated through the source of radiation. Then, the exposed photoresist layer is developed so that either the exposed portions or the non-exposed portions are removed from the workpiece. This process achieves a well-defined mask pattern on the metal nitride layer of exposed and covered, protected portions of the metal nitride layer. Then, the exposed, not protected portions of the metal nitride layer are etched in a dry etch process so that the underlying substrate is exposed upon removal of the metal nitride layer. A wet etch process may also be possible. The covered, protected portions of the metal nitride layer remain after removal or stripping of the residual photoresist layer portions.

As a result, the workpiece exhibits a well-defined pattern of exposed substrate portions, where metal nitride was removed by etching, and residual portions of the metal nitride layer that were covered by the photoresist mask. Because photolithography is a well-controlled and well understood process, the pattern can be generated with almost any desired structure and at controlled and reliable accuracy. The residual metal nitride portions have an orientation-disturbing function in that the microstructure of the metal nitride layer has substantially no major inherent direction of orientation.

As a next step, the bottom electrode metal layer is deposited. The metal layer inherits the orientation given by the respective underlying layer which is either the exposed substrate surface or the residual metal nitride layer according to the pattern generated by the above-described photolithography process.

As the next step, AlN will be deposited on the workpiece according to conventional methods. Those portions grown on the exposed surface portions of the substrate will grow with good C-axis orientation or columnar orientation or as crystals having a C-axis orientation. Those portions grown in the regions of the orientation-disturbing metal nitride layer will grow in amorphous or polycrystalline form. Process parameters to grow such an AlN are well-known in the art. The aluminum nitride may be deposited by a physical vapor deposition (PVD) using an aluminum target in a reactive nitrogen atmosphere. Other AlN deposition processes are also useful. The AlN grows with piezoelectric properties in the regions of the exposed substrate and without piezoelectric properties in the areas of the orientation-disturbing metal nitride layer simultaneously under the same deposition parameters. Accordingly, one single deposition process is used to simultaneously and concurrently grow AlN in piezoelectric and non-piezoelectric form depending on the underlying pattern of an orientation-disturbing metal nitride layer. The substrate is prepared such that it is possible to grow aluminum nitride in well and poorly C-axis orientation in a controlled way, wherein a seed layer is patterned to grow AlN thin films with and without piezoelectric properties adjacently. The present disclosure exploits the tendency of AlN to perform a self-oriented growth on an underlying structure. The underlying structure such as the metal layer is affected by the presence or absence of an underlying orientation-disturbing layer such as a metal nitride.

According to the present embodiment, titanium nitride proved to be a suitable metal nitride that has orientation-disturbing properties for the thereafter performed growing of AlN. By way of theoretical explanation, it is believed that titanium nitride has substantially no defined crystal structure and comprises substantially a mixture of a great variety of grains having different orientation. In addition, it is believed that the surface of the titanium nitride layer has high roughness. As a result, the bottom electrode metal layer deposited on top of the titanium nitride layer inherits the non-orientation of the titanium nitride layer so that the above-deposited AlN layer can also grow in the non-oriented form. Accordingly, titanium nitride is a preferred material to function as an orientation-disturbing layer as a basis for an AlN layer to be grown thereabove.

The metal layer of the bottom electrode of the to be formed electronic component inherits the structure caused by the underlying orientation-disturbing layer of the metal nitride, on the one hand, and the exposed substrate, on the other hand. The metal layer may comprise a sandwich of metal layers. A bottom layer of aluminum exhibits good conductivity. The layer of aluminum may include a small amount of copper forming an Al—Cu alloy. A thereon disposed top layer of tungsten has lower conductivity, but good adhesion properties for the later to be deposited AlN layer. Alternatively, the metal layer of the bottom electrode may comprise a composition of one or more of molybdenum, ruthenium, iridium and platinum, that may have a substantially homogenous form.

In the field of application of this disclosure, the metal layer has the function of the bottom electrode of an acoustic resonator such as a bulk acoustic wave (BAW) resonator. The AlN formed on the metal layer above the exposed substrate has piezoelectric properties so that it is part of the BAW resonator. The metal layer above the orientation-disturbing metal nitride layer is a seed layer for the deposition of non-oriented, non-piezoelectric AlN which may serve as a thermal conductor to transport the heat generated in the BAW resonator away from the resonator so that the resonator maintains tight operational specifications. In another example, the AlN formed on the metal layer above the orientation-disturbing metal nitride layer can be the dielectric of a capacitor of which the bottom electrode is the extended bottom electrode of the resonator. The BAW resonator may be used in an RF filter in a mobile communication device, for example in a bandpass filter. Other fields of application of the present disclosure comprise piezoelectric sensors and piezoelectric actuators.

The substrate on which the above-described structure is grown may have a top layer of a dielectric material. The dielectric layer may be part of an acoustical mirror such as a Bragg mirror arrangement of a BAW resonator. The Bragg mirror structure comprises a stack of alternately arranged layers of materials of high acoustic impedance and materials of low acoustic impedance. In an embodiment, the material of high acoustic impedance is tungsten and the material of low acoustic impedance is a dielectric such as silicon dioxide ($SiO_2$). The top layer of the Bragg mirror arrangement on the surface of which the bottom electrode of the acoustically active resonator portion is disposed is made of silicon dioxide.

Conventional methods to form aluminum nitride, for example, by PVD require an oxygen-free surface so that the grown aluminum nitride achieves a good adhesion to the underlying structure and inherits the crystal structure of the underlying layers. Before the growing of aluminum nitride, any oxygen must be removed from the underlying metal bottom electrode layer. In an embodiment, the oxygen cleaning of the bottom electrode may be performed in a hydrogen plasma atmosphere so that the spots of nucleation on the surface of the bottom electrode are accessible by the deposited AlN layer.

It is to be understood that both the foregoing general description and the following detailed description are merely exemplary, and are intended to provide an overview or framework to understand the nature and character of the claims. The accompanying drawings are included to provide a further understanding and are incorporated in, and constitute a part of, this description. The drawings illustrate one or more embodiments, and together with the description serve to explain principles and operation of the various embodiments.

DETAILED DESCRIPTION OF EMBODIMENTS

The present disclosure will now be described more fully herein after with the reference to the accompanying drawings showing embodiments of the disclosure. The disclosure may, however, be embodied in many different forms and should not be construed as limited to the embodiments set forth herein. Rather, these embodiments are provided so that the disclosure will fully convey the scope of the disclosure to those skilled in the art. The drawings are not necessarily drawn to scale but are configured to clearly illustrate the disclosure. The same elements in different figures of the drawings are denoted by the same reference signs.

Figure 1:
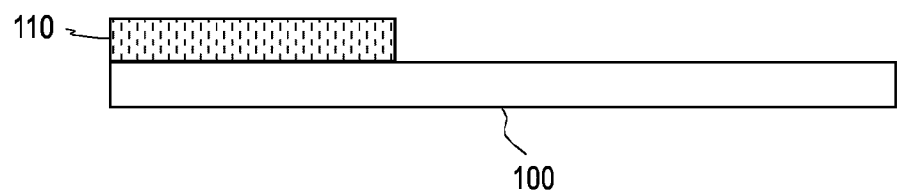
FIG. 1 shows a workpiece according to a first step of treatment comprising a patterned metal nitride layer and an exposed substrate portion.
Figure 2:
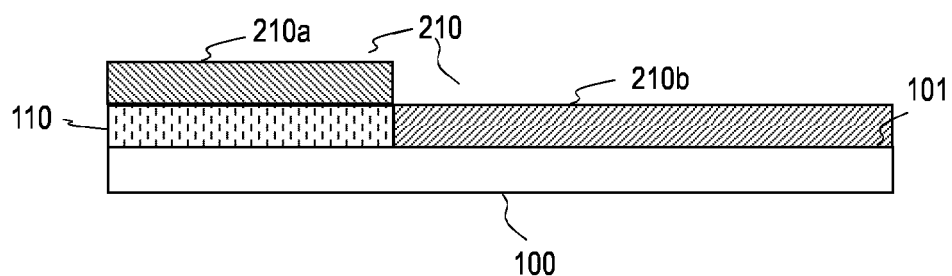
FIG. 2 shows another step of treatment of the workpiece with a metal layer deposited for a bottom electrode.
Figure 3:
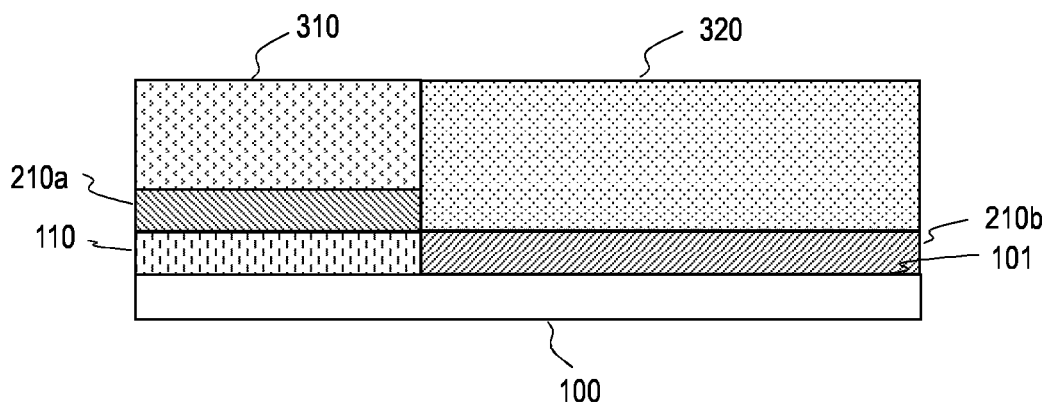
FIG. 3 shows yet another step of treatment of the workpiece having aluminum nitride deposited with a section of piezoelectric properties and a section without piezoelectric properties.

FIGS. 1 through 3 show cross-sectional views of consecutive steps of a workpiece treated in a process of forming an aluminum nitride (AlN) layer. Turning now to FIG. 1, a substrate 100 is shown on which the below-described structure is formed. The substrate may be a dielectric layer that is the top layer of a more complex layer arrangement. In the described embodiment, the substrate 100 is made of silicon dioxide ($SiO_2$) that is a portion of a bulk acoustic wave (BAW) resonator as described in more detail in connection with FIG. 6.

A layer of an orientation-disturbing or orientation-prohibiting material such as titanium nitride (TiN) is deposited. The TiN layer is structured according to a photolithography process so as to obtain a residual layer of TiN 110. The structuring comprises coating of the TiN layer with a photoresist, exposing the photoresist with a radiation pattern, developing the exposed photoresist, removing portions of the developed or undeveloped photoresist. The exposed portions of the TiN layer are dry etched relative to the remaining photoresist mask portions. The dry etch process may involve chlorine chemistry such as $BCl_3$ and $Cl_2$. In areas where the TiN layer is removed, the top surface 101 of the substrate 100 is exposed. The residual TiN layer 110 serves as an orientation-disturbing layer that prevents a C-axis oriented growth of a later to be deposited AlN layer.

FIG. 2 shows the workpiece having a metal layer 210 deposed thereon. Metal layer 110 may be the bottom electrode of an electronic device such as a BAW resonator of the solidly mounted resonator type as described in connection with FIG. 6. Metal layer 210 comprises a sandwich of aluminum including a small amount of copper and tungsten, consecutively formed on the surfaces of the residual TiN layer 110 and the exposed surface 101 of substrate 100. Metal layer 210 comprises a portion 210a disposed on patterned TiN layer 110 and portion 210b disposed on exposed portion 110 of substrate 100. The TiN layer portion 110 has substantially no internal preference orientation and may comprise a mixture of a multitude of grains of different size and orientation. Specifically, TiN layer 110 has no crystalline structure. Metal layer portion 210a is a substantially non-oriented bottom electrode structure that has inherited the non-crystalline multigrain structure of TiN layer portion 110. Metal layer portion 210b is a well-oriented bottom electrode structure, because it has no underlying orientation-disturbing layer, due to the fact that it is directly disposed on substrate 100.

Turning now to FIG. 3, a layer of aluminum nitride is simultaneously deposited on both portions 210a and 210b of the bottom electrode metal layer 210. The deposition parameters are such that portion 320 of AlN grown on well-oriented bottom electrode 210b on exposed portion of substrate 100 grows with good C-axis orientation so that AlN portion 320 exhibits good piezoelectric properties. The deposition of AlN on a bottom electrode structure such as 210b is well-known for the fabrication of a BAW resonator or any other electroacoustic components. Portion 310 of AlN is simultaneously grown on non-oriented portion 210a of the bottom electrode. Portion 310 of AlN inherits the structure caused by non-oriented bottom electrode portion 210a so that this AlN portion 310 has substantially no internal orientation. The AlN portion 310 has no C-axis orientation or columnar orientation or crystalline structure, because it is grown above orientation-disturbing TiN layer 110. Instead, AlN portion 310 exhibits a polycrystalline or amorphous structure. By use of a patterned titanium nitride layer 110 and a bottom electrode 210 disposed on the workpiece, piezoelectric layer AlN portion 320 and non-piezoelectric AlN portion 310 can be grown simultaneously without changing the deposition parameters of the deposition chamber. Bottom electrode layer 210a is deposited on the TiN layer 110 in a way that it impedes proper growth of a piezoelectric layer while good growth of piezoelectric AlN is promoted in areas that are directly on the substrate 100. The AlN film on top of exposed surface 101 of substrate 100 inherits the orientation of substrate 100 and hence has piezoelectric behavior where it is grown on the bottom electrode regions that are not on the orientation-disturbing layer 110.

In order to achieve a good adhesion of the AlN layer on the bottom electrode 210 and allow the forming of a C-axis oriented nucleation in area 210b and non-oriented growth in area 210a, it is useful to remove oxygen from the surface of metal layer 210 immediately before the deposition of the AlN to obtain an oxygen free surface. Oxygen removal may be performed in a hydrogen plasma.

While piezoelectric layer portion 320 can be used to manufacture an electroacoustic component exploiting the piezoelectric properties of layer 320, the adjacently deposited AlN layer 310 of the amorphous or polycrystalline type may be used to produce a capacitor having AlN layer portion 310 as the dielectric. AlN layer portion 310 can also serve as a thermal conductor to transport the heat generated in the piezoelectric component away to a heatsink so that the electrical specifications of the electroacoustic component have tolerable or substantially no temperature drift.

It is to be noted that the metal layer portion 210a disposed above the residual TiN layer portion 110 may be omitted. In this case, the AlN portion without piezoelectric properties is grown directly on the residual TiN layer portion 110.

Figure 4:
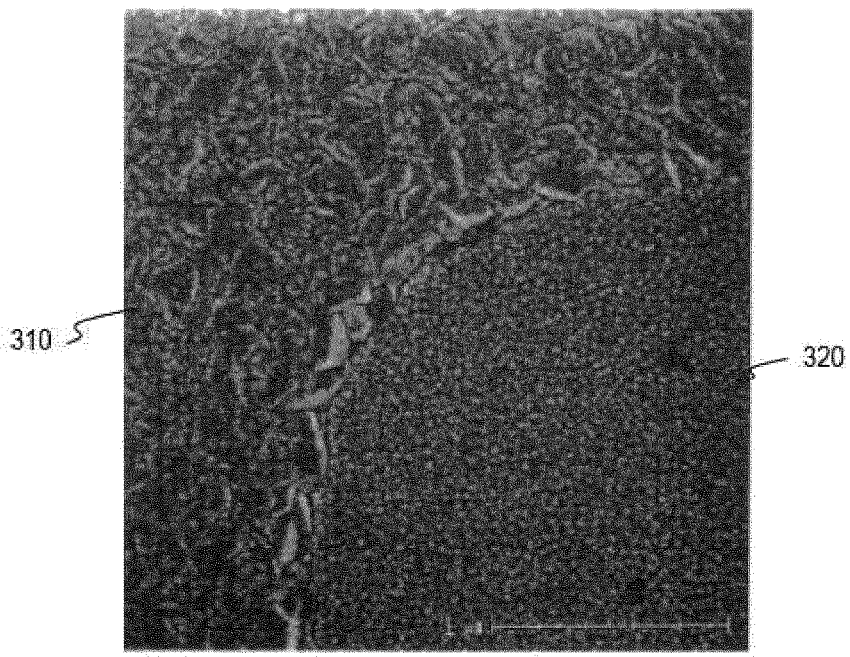
FIG. 4 shows a top view on the workpiece of FIG. 3.

FIG. 4 shows an SEM image which is a top view on the cross-sectional representation of FIG. 3. The lower right portion 320 shows AlN deposited with good C-axis orientation. The distinct C-axis columns can be individually identified in the image. The upper left portion 310 is the AlN deposited without C-axis orientation that is amorphous. As can be gathered at the border between portions 320, 310, the two areas have a defined transitional contact surface. There is a relatively sharp border line between piezoelectric portion 320 and non-piezoelectric portion 310. The portion 320 is generated by bottom electrode 210b directly disposed on surface 101 of substrate 100. The portion 310 is caused by non-oriented bottom electrode 210a disposed on orientation-disturbing TiN layer portion 110 disposed on substrate 100.

Accordingly, the present disclosure achieves the growth of an aluminum nitride thin film in good and poor C-axis orientation in a controlled way and to achieve portions of AlN with and without piezoelectric properties adjacently and next to each other having a common border surface.

Figure 5:
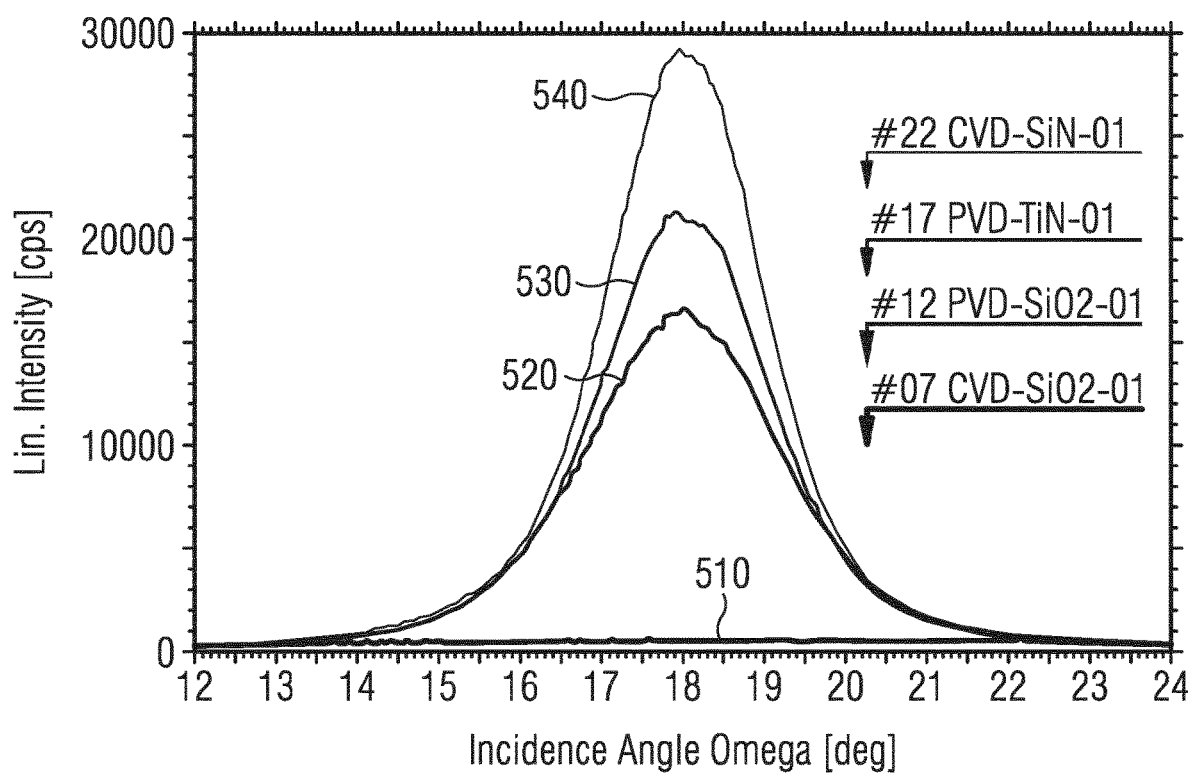
FIG. 5 shows rocking curve measurements of AlN thin-films grown on different material layers.

FIG. 5 shows an X-ray analysis using a rocking curve measurement of AlN films grown on different underlying materials. The horizontal axis represents the incident angle of the X-ray beam performing the rocking curve measurement in degrees. The vertical axis represents the linear intensity in cps units.

Curve 510 results from an AlN layer deposited on a PVD-generated TiN layer. Curve 510 is flat which indicates that the surface has no major orientational structure so that it is very irregular such as is shown in portion 310 of FIG. 4. Curve 520 results from an AlN layer grown on CVD-generated SiN (silicon nitride). Curve 530 results from an AlN layer grown on CVD-generated $SiO_2$. Curve 540 results from an AlN layer grown on PVD-generated $SiO_2$. Curves 520, 530, 540 include a maximum which indicates that the surface exhibits a preference orientation and has a regular structure such as is shown in section 320 of FIG. 4.

Figure 6:
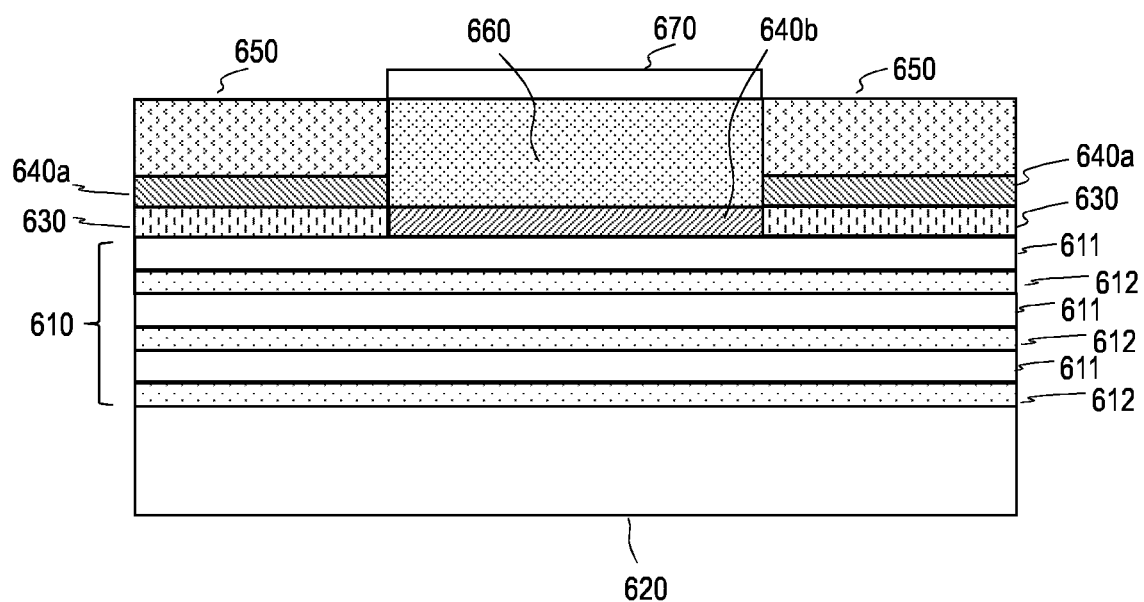
FIG. 6 shows a BAW resonator with piezoelectric AlN surrounded by amorphous AlN for a thermal conductor.

FIG. 6 depicts a cross-section of a BAW resonator. The structure is built on substrate 620 which may be a silicon wafer. Deposited thereon is a Bragg mirror arrangement 610 which is composed of an alternating sequence of material of high acoustic impedance such as tungsten 612 and material of low acoustic impedance such as $SiO_2$ 611. The top layer of Bragg mirror arrangement 610 is $SiO_2$ layer 611. The function of Bragg mirror 610 is to limit the propagation of an acoustic resonating wave into the substrate.

Disposed on $SiO_2$ Bragg mirror top layer 611 is a pattern of a TiN layer 630. Thereon disposed is a bottom electrode metal layer 640 having a portion 640b disposed directly on $SiO_2$ layer 611 and portions 640a disposed on patterned TiN layer portion 630. Thereon disposed is an AlN layer that has portions 650 on patterned TiN layer portions 630 and a portion 660 where the bottom electrode layer 640b is directly disposed on the $SiO_2$ layer 611. AlN portions 650 above orientation-disturbing TiN layer 630 exhibit no piezoelectric properties. Portion 660 disposed on bottom electrode portion 640b disposed directly on $SiO_2$ layer 611 has a strong C-axis orientation so that AlN layer portion 660 has piezoelectric properties. On top of AlN portion 660 is disposed a top electrode metal layer 670.

The BAW resonator of FIG. 6 of the solidly mounted resonator type establishes an acoustically resonating wave within piezoelectric layer 660 and between bottom and top electrodes 640b, 670. The acoustically resonating wave generates substantial heat that must be transported out of the acoustically active region to avoid a temperature drift of the electrical parameters of the resonator. For this reason, AlN layer portions 650 serve as a thermal conductor to transport the heat to a heatsink such as ambient air, the bulk portion of the Bragg mirror 610 or solder bumps (not shown in FIG. 6) or other heat-sinking elements thermally connected to AlN layers 650. As an advantage of the use of orientation disturbing TiN layer 630, the AlN portion 650 is amorphous and has no piezoelectric properties so that it does not disturb or affect the acoustically active regions 640b, 660, 670. Unwanted resonances are avoided in that the structures outside of the resonator do not exhibit resonating behaviour. On the other hand, AlN layer portion 650 benefits from the good thermal conductivity of AlN. The structure can be efficiently manufactured in that the AlN layers 650, 660 can be grown in one common process generating piezoelectric portion 660 and non-piezoelectric portion 650 simultaneously.

In a resonator such as the BAW resonator shown in FIG. 6, specific structures may be provided surrounding the acoustically active area 640b, 660, 670. Such structures are configured to exhibit a defined frequency and velocity profile that causes the acoustic wave to be substantially confined to the active area. The structures are configured to cause a reflection of the acoustic wave and substantially avoid a leaking from the active area. In this regard it is to be noted that piezoelectric AlN and non-piezoelectric AlN have different acoustic impedance and different acoustic velocity characteristics. A suitable layer stack design may be conceived by the skilled person using piezoelectric AlN and non-piezoelectric AlN that forms a lateral energy barrier for the acoustic wave so that the acoustic wave is substantially prevented from escaping from the active area. These lateral structures forming a lateral energy barrier can be achieved with alternately depositing piezoelectric and non-piezoelectric AlN using the orientation-disturbing metal nitride layer concept of the present disclosure. The quality factor of the resonator is thereby increased.

It will be apparent to those skilled in the art that various modifications and variations can be made without departing from the spirit or scope of the disclosure as laid down in the appended claims. Since modifications, combinations, sub-combinations and variations of the disclosed embodiments incorporating the sprit and substance of the disclosure may

The invention claimed is:

1. A method for forming an aluminum nitride layer, comprising the steps of:
   forming a metal nitride layer on a substrate;
   patterning the metal nitride layer to form a residual metal nitride layer and to expose a portion of the substrate;
   forming a metal layer on the exposed portion of the substrate; and
   forming an aluminum nitride on the metal layer and above the residual metal nitride layer, wherein the aluminum nitride formed on the metal layer possesses a piezoelectric property and the aluminum nitride formed on the residual metal nitride layer possesses no piezoelectric property.

2. The method according to claim 1, wherein the forming of the aluminum nitride comprises simultaneously depositing the aluminum nitride in an area of the exposed portion of the substrate and in an area of the residual metal nitride layer.

3. The method according to claim 1, further comprising forming the metal layer on the residual metal nitride layer and on the exposed portion of the substrate; and forming the aluminum nitride on the metal layer.

4. The method according to claim 1, wherein the patterning of the metal nitride layer comprises a photolithography process comprising one or more of coating the metal nitride layer with a photoresist layer, exposing the photoresist layer with a pattern of radiation, developing the exposed photoresist layer, removing portions of the developed or the undeveloped photoresist layer to expose portions of the metal nitride layer, etching the exposed portions of the metal nitride layer and stripping the residual photoresist layer.

5. The method according to claim 1, wherein the forming of the aluminum nitride comprises depositing the aluminum nitride:
   in an area of the exposed portion of the substrate, wherein the aluminum nitride in the area of the exposed portion of the substrate possesses at least one of crystalline properties or C-axis orientation; and
   in an area of the residual metal nitride layer, wherein the aluminum nitride in the area of the residual metal nitride layer possesses amorphous or non-crystalline properties.

6. The method according to claim 1, wherein the forming of the metal nitride layer comprises forming of a titanium nitride layer.

7. The method according to claim 1, wherein the forming of the metal layer comprises one of:
   forming of a sandwich of aluminum and tungsten;
   forming of a sandwich of aluminum, copper alloy and tungsten; or
   forming of a composition of one or more of molybdenum, ruthenium, iridium and platinum.

8. The method according to claim 1, wherein the substrate comprises a workpiece having a top layer of a dielectric material.

9. The method according to claim 8, wherein the workpiece has a top layer of silicon dioxide.

10. The method according to claim 8, wherein the workpiece includes a bragg mirror arrangement, and wherein the bragg mirror arrangement comprises the top layer of silicon dioxide.

11. The method according to claim 1, further comprising removing oxygen from the metal layer prior to forming of the aluminum nitride.

* * * * *